Sept. 24, 1974 C. R. SPORCK 3,838,094

MOLDING COMPOSITION AND MOLDED PRODUCT

Filed April 23, 1973

United States Patent Office 3,838,094

Patented Sept. 24, 1974

3,838,094

MOLDING COMPOSITION AND MOLDED PRODUCT

Christian R. Sporck, Santa Clara, Calif., assignor to National Semiconductor Corporation, Santa Clara, Calif.

Filed Apr. 23, 1973, Ser. No. 353,458
Int. Cl. C08g 51/04
U.S. Cl. 260—37 EP 7 Claims

ABSTRACT OF THE DISCLOSURE

Molding compositions for electrical devices such as integrated circuit devices, and resulting product. Molding compositions comprise epoxidized novolac prepolymer; novolac prepolymer as cross linking agent, catalyst (preferably an imidazole) which is free of ionic components likely to detract from insulating characteristics and a filler in the form of finely ground fused silica which has been surface treated to remove all or substantially all hydrophilic groups.

This invention relates to encapsulation of electrical and electronic devices.

More particularly, this invention relates to the encapsulation of very small solid state devices, such as integrated circuits and to molding compositions to be used for such encapsulation.

Figure 1:
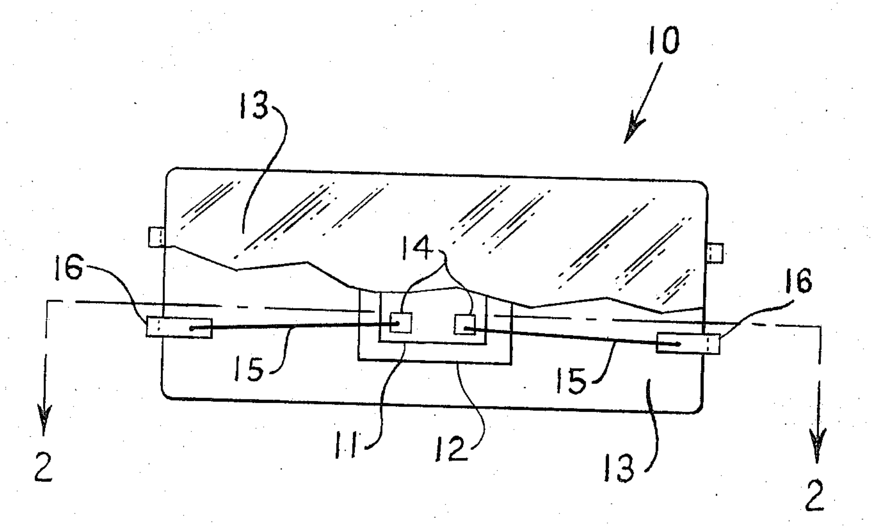
Figure 2:
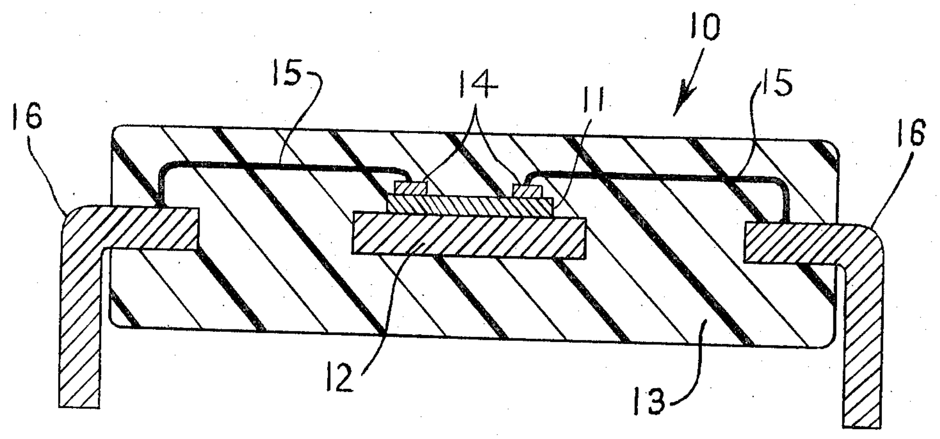

A typical instance of the environment in which the molding composition of the invention is used is an integrated circuit device such as that shown in the accompanying drawings in which;

FIG. 1 is a top plan view of an integrated circuit drawn with the encapsulating medium broken away to reveal more clearly the silicon chip, lead wires and pins; and FIG. 2 is a section through the device taken along the line 2—2 of FIG. 1.

Referring to the drawings, the device is generally designated by the reference numeral 10 and it comprises a silicon chip 11 bonded to a metal base 12 both of which are embedded in a body of encapsulating medium 13. Aluminum pads 14 are bonded to selected areas of the chip and gold lead wires 15 are each connected at one end to one of the pads 14 and at its other end to a pin 16, the inner end of which (connected to a lead wire 15) is embedded in the encapsulating medium 13. The other end of each pin is external to the encapsulating medium and serves as a connection to an external circuit. The chip 11, as is well known, embodies various circuit elements such as resistors, capacitors, flip flops etc. FIGS. 1 and 2 are simplified. Thus only four pins 16 are shown, whereas in practice there may be many such pins and a lead wire 15 and pad 14 for each. The base 12 and pins 16 are remnants of a metal framework which is cut to prevent short circuits as is well known in the art.

The dimensions of the device and its components are very small; e.g. the chip 11 typically is 0.010" thick and 0.0035" x 0.038" in its horizontal dimensions; the lead wires 15 have typically a diameter of about 0.001"; the pins 16 are typically about 0.018" in width and the dimensions of the body 13 of encapsulating material have a typical thickness of 0.130" and horizontal dimensions of about 0.250" x 0.250".

The present invention is not limited to the encapsulation of such small and delicate solid state devices, but it provides special advantages in such devices for the following reasons, among others.

A considerable number of requirements should be satisfied by a molding composition intended for this purpose. For example, the composition should have an adequate shelf life, typically about 1 month at temperatures up to about 77° F., such that the complete molding composition including the polymerizable ingredients and the catalyst may be kept in storage under such conditions for such a period of time without prepolymerization. The composition should also be one which, at the temperature of molding and encapsulation, typically about 320–340° F. and at a typical molding pressure of about 400 to 800 p.s.i. gauge, will assume a liquid form of proper viscosity. Too high a viscosity makes it difficult to force the molding material into the very small apertures of the mold cavities, and too low a viscosity is likely to result in extrusion of the molding compound from the mold through the very small spaces between the mating sections of the mold. It is important, of course, that the mold cavities be filled completely and uniformly, otherwise faulty devices result. It is also disadvantageous to have leakage of the material from the mold, because not only does this represent a waste of material but even more importantly, the extruded material will form an insulating layer on pins and the like, such that proper connections cannot be made. Also, the rheology of the molten composition whilst in the mold at a molding temperature and a molding pressure such as those described above and whilst in a liquid state before it has cured to a solid state should be such that the liquid part of the composition (which is a heterogeneous system comprising liquid organic material and solid mineral filler) does not extrude through the small spaces between mating sections of the mold. This selective leakage is called "bleeding" and it forms a strongly adherent film on the pins which is very difficult to remove and, if not removed, interferes greatly with tinning these pins preceding soldering the pins as is common practice.

Moreover, the viscosity and other rheological properties of the liquid molding compositions whilst flowing into the mold should be such that it does not distort the fragile lead wires and cause short circuits, such distortions being referred to in this art as "lead wash." Also the compositions should not be excessively abrasive to the mold.

The molding composition should be one which when heated to about 320° to 340° F. (which is typical of molding temperatures employed in this art) will cure to the final shape and dimensions within a very short period of time. For example, the cured encapsulating material should be free of voids and bubbles. From an esthetic standpoint, its surface should be free of spots or splotches due to migration of release agent, although this may not have an adverse effect upon performance. The cured encapsulating material should also be free of ions, such as the chloride ion and the sodium ion, which are electrically conductive and are inconsistent with the insulating requirements of the encapsulating medium. The sodium ion is especially troublesome because it migrates to the vitreous oxide layer on the chip and penetrates it. Also the encapsulating medium should be resistant to penetration by moisture, and it should also be resistant to thermal degradation at temperatures of about 390° F.

It is a purpose of the present invention to provide molding compositions which meet all or most of these desiderata, but in cases where such rigid requirements are not needed, e.g. in the encapsulation of larger and more rugged electrical devices, compositions which do not meet all of these requirements are within the scope of the invention.

It is an object of the present invention to provide molding compositions of an improved character for encapsulating electrical and electronic devices.

It is a further object of the invention to provide a molding composition which has a long shelf life at temperature of about 77° F.

It is another object of the invention to provide a molding composition of the character and for the purpose described which when heated to about 320° to 340° and forced at a pressure of about 400 to 800 p.s.i. gauge into small cavities, such as those in a mold of the character described, has a viscosity such that it will completely and uniformly fill the mold yet not so low to be extruded from the mold through joints between the mold sections.

The above and other objects of the invention will be apparent from the ensuing description and the appended calims.

I have found that a greatly improved composition for encapsulation of solid state devices is provided as follows:

An epoxidized novolac of the Formula I is provided

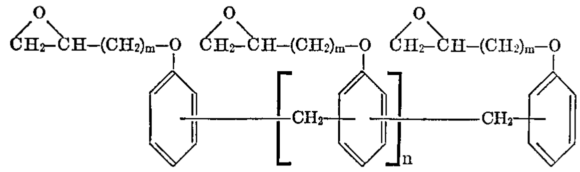

I

In Formula I, *m* is a small whole number greater than zero, for example, 1 to 3, and *n* is also a small whole number having a value between 3 and 8, and preferably averaging about 6. This ingredient of my molding composition may be a single molecular species but it usually will be a mixture such that *n* represents an average. The number *m* may also be an average, although usually it will have a fixed value, such as unity. The methylene groups connecting the aromatic rings may occupy the ortho, para or meta positions in relation to the oxygen atom of the pendant epoxide groups, and the ingredient I may be a mixture in relation to this factor; i.e., I may be a pure species as regards the ortho, para and meta isomers, or it may be a mixture of two or more such isomers. Not all of the phenolic hydroxyls need be epoxidized although it is preferred that all or nearly all be epoxidized. One or more of the benzene rings may be substituted by inert substituents such as lower alkyl (methyl, ethyl, propyl, etc.) or by a second benzene ring which may be attached by a covalent link (as in biphenyl) or may be fused ring (as in naphthalene). Where $m=1$, the minimum epoxy equivalent of I (i.e., the epoxy equivalent for I in the case where *m* is unity and the benzene rings are unsubstituted) is 158. I have found that epoxy equivalents of 170 to 220 are useful. In cases where the formula of I is modified, e.g. *m* is 2 or more and/or the benzene rings are substituted corresponding epoxy equivalents are suitable.

The epoxy ingredient I is mixed with a filler, which is fused silica having a size distribution as set forth below. The fused silica filler is coated with a silazane as described under the heading "The Filler and Its Surface Treatment." As explained below, this filler is preferably divided between that portion (Part A) of the complete molding composition which contains epoxy ingredient I and that portion (Part B) of the molding composition which does not contain ingredient I. Part B is described below.

Part A also preferably contains a small amount e.g. 0.5 to 1.0% of a mold release agent such as montan wax or carnauba wax.

The second portion (Part B) of the molding composition of the invention contains as the principal or only reactive ingredient a novolac having the Formula II.

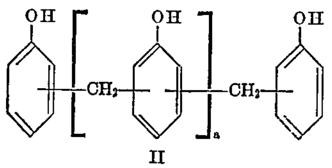

II

In Formula II, the subscript *a* has an average value of approximately 6, but it may vary from that figure consistently with the following factors: If *a* is much lower than 6, the novolac II is excessively volatile and may be lost during processing and/or the cross-linking density, hence the mechanical strength of the end product may be too low. If *a* is too large, the mixture of Parts A and B is inconveniently stiff and difficult to mix. As in the case of the epoxide I the methylene groups of the novolac II may be ortho, meta or para in relation to the hydroxyl groups or a mixture of two or more such isomers may be used. Also as in I, the benzene rings of II may be substituted by inert groups such as alkyl (methyl, ethyl, propyl, etc.) or by phenyl groups as in biphenyl or fused phenyl groups as in naphthalene.

A further ingredient of Part B is a portion of the treated silica filler. Inasmuch as the filler constitutes a major portion of the final, complete molding composition, it is preferably divided between Parts A and B.

Yet another ingredient of Part B is the curing catalyst. Any non-metallic catalyst which is effective to catalyze the polymerization of epoxides may be used such as aliphatic amines (e.g. polymethylene diamines $H_2N(CH_2)_nNH_2$ and their branched chain isomers; polyamines such as diethylenetriamine and aminoethylethanolamine); aromatic primary amines (e.g. m-phenylene diamine; 4,4'-methylene dianiline diaminophenyl-sulfone and benzidine); ethylene imines such as

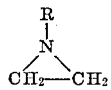

wherein R=H, methyl, propyl; acid anhydrides (e.g. succinic, citraconic and maleic anhydrides; pyromellitic dianhydride; phthalic anhydride), etc. Many examples of suitable epoxy curing catalysts will be found in Lee & Neville, Epoxy Resins, Chapter 7, 8 and 12. Also more recent catalysts which have phosphorus instead of nitrogen may be used in place of an amino catalyst, examples being triphenyl and tributyl Phosphens and mixed alkyl aryl phosphines.

However, a preferred class of catalysts is the class of imidazoles having the general Formula III

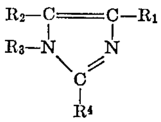

III

In Formula III, the R's may be the same or different and they are selected from the group consisting of hydrogen and hydrocarbon groups, such as lower alkyl (methyl, ethyl, propyl, etc.); aryl (e.g. phenyl, naphthyl); lower alkyl (methyl, ethyl, etc.) substituted phenyl; aralkyl (e.g. benzyl) and cycloaliphatic (e.g. cyclohexyl). R's having functional groups are suitable provided they are inert with respect to or do not interfere with the polymerization and cross linking reactions and do not contribute undesirable electrical characteristics to the end product. A preferred catalyst is 2-phenyl imidazole,

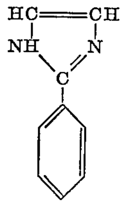

Examples of other suitable imidazoles are:

2-methylimidazole
2-ethyl-4-methylimidazole
2-undecylimidazole
2-heptadecylimidazole 1-benzyl-2-methylimidazole
1-cyanoethyl-2-methylimidazole
1-cyanoethyl-2-phenylimidazole
1-cyanoethyl-2-undecylimidazole
1-cyanoethyl-2-ethyl-4-methylimidazole
1-cyanoethyl-2-methylimidazole-trimellitate
1-cyanoethyl-2-phenylimidazole trimellitate
2,4-diamino-6-(2′-methylimidazolyl-(1′))ethyl-s-triazine.

The superior character of the imidazoles for purposes of the present invention appears to be due to the fact that strain imposed by the five-membered ring avoids steric hindrance of the nitrogen atom or atoms which are effective in the catalysis. The preferred imidazoles, especially 2-phenyl imidazole, are well suited to the purposes of the present invention in that they provide a molding composition which has a good shelf life at temperatures up to about 77° F., yet when the composition is heated to a temperature of about 320°–340° F. and forced into a mold the cure time is very short; for example, about 1½ minutes. If shorter cure time and shorter shelf life can be tolerated or are desired, a more active catalyst may be used, and if a longer cure time and/or a longer shelf life are desired, a less active catalyst may be used. Examples of more active catalysts are imidazole itself (i.e., all R's in III are hydrogen): also ethylene imines

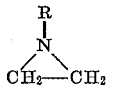

where R is an alkyl (e.g. methyl, ethyl, etc.) or aryl (e.g. phenyl) substituent or hydrogen.

Examples of less active catalysts are 1-cyano-2-methyl imidazole trimellitate and the 2-phenyl analogues, also the acyclic tertiary amines. The trimellitates referred to above, being high melting (175–176° C. for the 2-methyl compound and 181–182° C. for the 2-phenyl compound) adapt them to slower cure schedules.

Part B also contains a portion of the filler (see below) and a portion of the mold release agent.

The Filler and Its Surface Treatment

The filler is a fused silica that has been ground to a fineness such that its size specifications are as follows:

| Particle size (in microns) | Percent through at— Minimum | Maximum |
|---|---|---|
| | Wet grind silica | |
| 20 | 94 | 100 |
| 10 | 77 | 91 |
| 5 | 55 | 70 |
| 2 | 30 | 48 |
| | Dry grind silica | |
| 20 | 73 | 99 |
| 10 | 41 | 74 |
| 5 | 19 | 40 |
| 2 | 4 | 16 |

In the table above, the wet grind silica was a product of Glass Products, Inc. known as GP3I and the dry grind silica was also a product of Glass Products, Inc. known as GP7I. Both are useful in the present invention. The wet grind silica is more difficult to blend in Part A of the formulation than the dry grind but it is preferred because of its finer particle size. The blending of the wet grind is improved by the silazane coating described below.

The fused silica is treated with a silazane having in its molecule one or more of the groups IV:

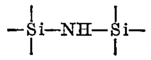

IV in partial Formula IV, the valences of the silicon atoms (other than those which are linked to an imino nitrogen atom) are satisfied by inert hydrocarbon groups, such as methyl, ethyl, etc. Examples of suitable silazanes are hexamethyl disilazane $$(CH_3)_3Si—NH—Si(CH_3)_3$$

and octamethyl cyclotetrasilazane

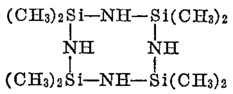

IVb and hexamethyl cyclotrisilazane

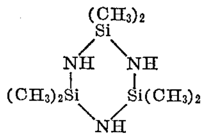

IVc

As will be apparent, the silazane IV may be an open chain or a cyclic compound. Also the methyl groups of the silazanes IVa, IVb, and IVc may be substituted by other hydrocarbon groups as explained above.

The fused silica is treated with a silazane (or with a mixture of silazanes) either dissolved in a volatile solvent, such as petroleum ether, which is removed after mixing with the silica by application of heat, or the mixing is carried out dry in suitable mixing equipment, such as a Henschel or Lotige mixer which are known commercial mixers. The amount of silazane used may vary from about 0.5 to 2.0% of hexamethylsilazane (or equivalent amounts of other silazanes) based on the weight of fused silica. In any case, the entire silica surface should be coated uniformly with the silazane. The coated silica is then held for some time, for example for about 5 hours at a temperature of about 100° to 120° C. to bring about completion of reactions and evolution of ammonia. It appears that adsorbed water on the silica particles is absorbed by or reacts with the silazane and is thereby removed and that silanol groups

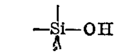

on the silica react with the silazane to substitute groups such as

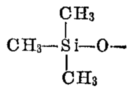

for hydroxyl groups. In any event, the surface-treated silica is beneficially modified. The surface properties of the silica filler are modified such that the silica contains no moisture or substantially no moisture and contains substantially no free silanol groups. Empirically, it has been found that this treated silica, although much more dense than water, will float on top of water because it is so free of hydrophilic matter that is not wetted.

The proportion of treated silica filler in the completed molding composition (Part A and Part B) is in excess of 50%, preferably about 62 to 72% of the weight of the entire molding composition. This filler is employed in the present invention for the normal functions of a filler which are to dilute more expensive ingredients, to provide bulk and mechanical strength and to reduce the coefficient of thermal expansion. The fused silica has a particularly beneficial effect on thermal expansion. Typically it reduces the coefficient of thermal expansion to less than $24\times10^{-6}$ inch/inch/degree C.

As noted above, the viscosity of the molding composition is quite important while it is in the molten liquid state and is being forced into a mold. Too high a viscosity results in incomplete or uneven filling of the mold and too low a viscosity results in extrusion of some of the molding composition from the mold. Also viscosity and other rheological properties affect lead wire distortion. For purposes of the present invention a spiral flow of 26 to 40 inches is desirable, most advantageously about 27 to 30 inches.

In measuring spiral flow for purposes of the present invention the method known as EMMI Method I-66 published by the Society of the Plastics Industry, Inc., Epoxy Molding Materials Institute is employed including a ram speed of one inch per second and a pressure of 1000 p.s.i. However, I have found it convenient to employ a temperature of 160 to 165° C. and to preheat the slugs of compound molding compositions, which are 25 gram slugs. I have further found that the spiral flow depends upon, i.e. it is a function of, the time of preheating and that if slugs made from the same lot of molding material (therefore having the same intrinsic spiral flow) are heated for different periods of time, the spiral flow increases from zero preheating to a maximum and then decreases. Therefore, I determine the preheating of slugs from a given lot of material which results in maximum spiral flow and all the remaining material, after forming into slugs, is preheated for the same period, such that they all have approximately the maximum, hence approximately the same spiral flow. In an illustrative case it was found that slugs formed from four lots of material had initial spiral flows (no preheat) of 23.6, 23.5, 23.0 and 19.0 inches but when preheated to maximum spiral flow had spiral flows of 31.6, 35.0, 35.6 and 30.5 inches, respectively.

Further I have found that the manner of treatment of the filler has an effect on spiral flow. Thus, if the fused silica-silazane mixture (after being thoroughly blended) is baked immediately to remove volatile material, the spiral flow of resulting slugs is at a maximum. If the silica-silazane mixture is held for a time after blending and before baking, the spiral flow of resulting slugs diminishes almost linearly with the dwell time between mixing and baking. In two typical cases including a completely dry ball mill blending of Parts A and B and a blending of Parts A and B by melting them and then solidifying and pulverizing, the spiral flow diminished at the rate of 2.3 inches for each hour of dwell time for forming the silica-silazane mixture.

Heretofore, control of spiral flow (which is essential to obtain reproducibility) has been exercised by controlling the amount of filler (more filler providing lower spiral flow and *vice versa*) and the degree of prepolymerization (a greater degree providing lower spiral flow and *vice versa*). In accordance with my invention, control is exercised by preheating the slugs (in accordance with data obtained by experimentation) so that spiral flow is at a maximum and by the dwell time in forming the filler. Therefore, the vagaries and difficulties of controlling the degree of prepolymerization are avoided and much more dependable, reproducible results are achieved.

As stated above, the treated fused silica employed in accordance with the present invention constitutes 50% or more of the completed molding composition, and it is preferably divided between Parts A and B so that their densities are not greatly different. Parts A and B are commingled in proportions such that the molar ratio of I and II ranges from approximately stoichiometric to about 35 to 40% molar excess of I.

The following specific examples will serve further to illustrate the practice and advantages of this invention.

EXAMPLE 1

Surface Treatment of Silica (Solvent Process)

In a large container are placed 4.5 kilograms of fused silica (Glass Rock Products GP-3I) and a mixture of 30 grams of hexamethyl disilazane (HMS) in 3000 ml. of pentane. This is mixed to produce a smooth slurry. The mixture is then poured in trays to a depth of about ¾ inch and left in a ventilated hood to dry overnight (16 hours). The mixture is dry and has a slight odor of ammonia but not of pentane. This powder is placed in an oven at 125° C. for four hours to drive off the remaining ammonia. When cooled, the material gives no test for basic constituents if the powder is triturated with water. In fact, no mechanical effort at room temperature is successful in bringing about wetting of the treated filler with water without the addition of a wetting agent. This indicates the high degree of hydrophobicity conferred by this treatment.

Still another measure of the sealing effect of this treatment (HMS) is given by conductivity measurements. A five percent slurry of the GP-3I, untreated, is made in deionized (DI) water. The specific conductivity of the water was $H_0=0.06\times10^{-6}\ \Omega^{-1}\ \text{cm.}^{-1}$. The conductivity of the 5 percent slurry is $H=0.16\times10^{-6}\ \Omega^{-1}$. When the slurry is washed twice with DI water the conductivity is $H^1=.07\times10^{-6}\ \Omega^{-1}\ \text{cm.}^{-1}$. This is a measure of the conducting species in the washed filler. Since the conductivity is proportional to the concentration of conducting species, it has been reduced by a factor of ten in the washing. If treated filler prepared as above is placed in the DI water, the conductivity is unchanged from the DI water or $0.06\times10^{-6}\ \Omega^{-1}\ \text{cm.}^{-1}$. The treatment has the effect of dropping the conducting matter by a factor of 10.

EXAMPLE 2

Surface Treatment of Silica (Solventless Process)

This is a more efficient method for larger scale treatment. For this purpose, a model FM103D (12) Lotige mixer available from Littleford Bros. Inc., Cincinnati, Ohio, was used. Approximately 100 lbs. of the same silica as in Example 1 were loaded into the mixer. One pound of HMS was placed in a pressure cannister and nitrogen was introduced to 30 p.s.i. A tube was connected from the cannister to a spray nozzle in the mixer. The mixing was started and the HMS introduced in short bursts over a period of about 8 minutes. The mixing was continued for a total of 12 minutes including 8 minute period of introducing HMS, after which the powder was discharged and the residual silazane baked out at 125° C. The powder had the hydrophobicity described in Example 1.

EXAMPLE 3

Part A was formulated as follows:

| | Grams |
|---|---|
| (1) Epoxidized novolac | 1026 |
| (2) Montan wax | 28.8 |
| (3) Treated silica of Ex. 1 | 2535 |

This mixture was mixed as a melt in a commercial sigma mixer blade under vacuum until it was homogeneous and was then allowed to solidify and was pulverized to pass a 100 mesh screen.

Part B was formulated as follows:

| | Grams |
|---|---|
| (4) Novolac | 578.8 |
| (5) Montan wax | 14.4 |
| (6) Treated silica of Ex. 1 | 1121.8 |
| (7) 10% solution of 2-phenyl imidazole in novolac (4) | 91.8 |

The epoxidized novolac (1) in Part A was a product of Dow Chemical Company designated as Dow XD7230; it has essentially Formula I above with (it is believed) unsubstituted benzene rings and had an epoxy equivalent of about 250. *n* averages about 6 and *m* is one.

The novolac (4) of Part B [also used as solvent in component (7) of Part B] was a product of Union Carbide Company of Formula II.

Part B was mixed in molten condition allowed to solidify and then ground to pass a 100 mesh screen as with Part A.

Parts A and B were mixed in the ratio of 1 part by weight of Part A to 3.14 parts by weight of Part B and formed by pressure into cylindrical slugs suitable for molding.

This material was then molded on commercial integrated circuit devices such as those described above and shown in the drawing under the following conditions. Temperature 166° C., pressure 625 p.s.i., time to fill the 20 cavity mold 15 sec. Spiral flow at ram speed of 1 inch/sec., temperature of 166° C., pressure 1000 p.s.i. was 24 inches. The moldability was good. A control of a good quality commercially available molding compound based on an epoxidized novolac was run with this on the same devices having silicon chips cut from the same wafer, to minimize differences due to different chips. All packages were baked out 24 hours at 175° C.

EXAMPLE 4

| | Grams |
|---|---|
| Part A: | |
| (1) Epoxidized novolac | 595.0 |
| (2) Montan wax | 16.7 |
| (3) Treated silica | 1476.2 |
| Part B: | |
| Novolac (4) of Example 3 | 520.2 |
| Montan wax | 12.8 |
| 10% 2-phenyl imidazole in same novolac | 49.6 |
| Treated silica of Example 3 | 1014.4 |

Parts A and B were prepared as in Example 1 and were mixed in the ratio of 2.589 parts of A to 1 part of B and preformed into slugs for molding.

The epoxidized novolac of Part A was a product of Dow Chemical Co. known as Dow XD7855; it was of the type of Formula I and it had an epoxy equivalent of about 200. $n$ has an average of about 6 and $m$=one.

This material was molded on devices as in Example 3 under the following conditions: Temperature 168° C., pressure 625 p.s.i. Fill time 15 sec. The spiral flow at 168° C., pressure 1000 p.s.i., ram speed 1 inch/sec. was 25 inches. The moldability and mold release were good. The packages were baked out 24 hours at 175° C.

EXAMPLE 5

| | Grams |
|---|---|
| Part A: | |
| Epoxidized novolac of Example 4 | 427.1 |
| Flame retardant | 101.5 |
| Montan wax | 8.3 |
| Treated silica of Example 3 | 1295.8 |
| Part B: | |
| Novolac of Example 3 | 445.5 |
| Montan wax | 11.2 |
| Carbon black | 12.4 |
| Treated silica of Example 3 | 892.6 |
| 10% 2-phenyl imidazole in same novolac | 49.6 |

These parts were treated and blended as in Example 3. The flame retardant was a commercially available product, a highly brominated bisphenol A. The carbon black was used as a pigment. Parts A and B were mixed in the ratio of 2.847 parts A and 1 part B and formed into slugs.

This material was molded on devices as in Example 3 under the following conditions: Temperature 164° C., pressure 625 p.s.i., fill time 15 sec. Spiral flow at temperature 167° C., pressure 1000 p.s.i., ram speed 1 inch/sec. was 26 inches. The moldability was good. A control was run on the same wafer with a good quality epoxidized novolac available commercially. All units were baked out 24 hours at 175° C.

EXAMPLE 6

| | Grams |
|---|---|
| Part A: | |
| Union Carbide ERRE 0100 epoxidized novolac | 1055 |
| Montan wax | 25.2 |
| Treated silica | 2520 |
| Part B: | |
| Novolac of Example 3 | 488.4 |
| Montan wax | 10.5 |
| 9.2% solution of 2-phenyl imidazole in same novolac | 41.8 |
| Treated silica | 859.6 |

Parts A and B were treated as in Example 3 and mixed in ratio of 3.26 parts A and 1 part B. The epoxidized novolac of Part A was similar to that of Example 4 but of somewhat higher molecular weight. The treated silica was a 70:30 by weight mixture of the GP–7I and GP–3I silicas described above and treated as described in Example 1 by HMS.

This molding composition was formed with slugs and tested at 105° F. against a commercially available material of good quality sold for the same purpose. Spiral flow was 31 inches at 164° C., 1000 p.s.i. and ram speed of 1 inch/sec., compared to 23 inches for the commercial material. Storage results were as follows: Molding compound of Example 6 had a spiral flow of 30 after 7 days whereas commercial molding compound had a spiral flow of 8 in 9 days. Nine day spiral flow for the molding compound of Example 6 was not measured, but it was deemed certain that it would not have dropped to a low figure. Two day spiral flow for the commercial compound was 21.5.

In the examples above, all compositions prepared according to the invention had good moldability, by which is meant that the molded product had no bubbles or voids and that the molds were uniformly filled.

Molded products made as described in the foregoing examples were subjected to a number of tests in comparison with commercially available products identically made but with commercially available molding compositions considered to be of good quality. In a typical comparison, integrated circuit devices of known, standard type prepared with a commercially available molding composition considered to be of good quality, also those prepared with the molding compositions of the present invention, were tested for electrical characteristics in accordance with known and accepted test procedures. The commercial product (prepared with commercially available molding material) typically exhibited many more failures than those made with the molding compositions of the invention. Other tests in autoclaves showed similar results.

The surface treated fused silica filler described above is useful not only for molding compositions of the type described in Examples 3 to 6 above but also for other heat curable molding compositions such as epoxidized novolacs such as I above with anhydride (e.g. hexahydrophthalic anhydride) or amine (e.g. diethylene triamine and other polyfunctional amine) hardening agents; bisphenol A type epoxides together with novolac hardener or anhydride or amine hardeners such as described above, etc. The fused silica preferably has a particle size such that 70% or more is smaller than 20 microns but 20% or more is larger than 5 microns, most advantageously 90% or more smaller than 20 microns and 50% or more larger than 5 microns. It is known to surface treat extremely fine silica which is smaller than 1 micron, and is made by combustion of silicon tetrachloride, and to do so with silazanes. Such surface treated silica is used for silicone rubber compounding. To my knowledge it is novel to treat fused silica (as distinguished from silica produced by combustion of silicon tetrachloride) of a larger particle size (such as described above) with silazanes, and it is novel and very useful to employ such surface treated fused silica as a filler for heat curable molding compositions.

It will therefore be apparent that new and useful molding compositions and molded products are provided.

I claim:

1. A molding composition comprising an epoxidized novolac prepolymer I, a novolac II, a catalyst selected and in a quantity effective to catalyze the polymerization of I and cross linking with II, said catalyst being also selected so as not to confer electrically conductive properties on the cured material, and an amount not less than about 50% by weight of the composition of a surface-treated fused silica, said prepolymer I having the formula

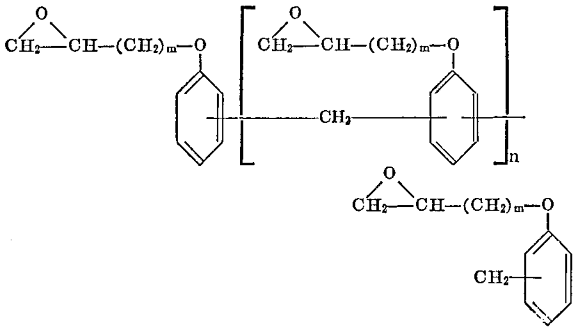

wherein *m* and *n* are small whole numbers greater than zero and wherein all or substantially all of the phenolic hydrogens are substituted by a group

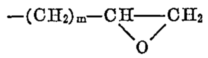

and said prepolymer II having the formula

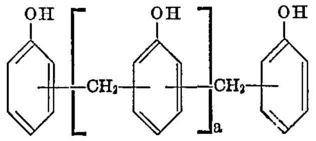

wherein *a* is a small whole number greater than zero, said prepolymers being present in a ratio between about stoichiometric and about 40% molar excess of I, said fused silica filler being a finely ground fused silica the surface of which is modified by surface treatment with a silazane to render the silica particles substantially free from adsorbed moisture and free silanol groups and such that the silica is not wetted by water.

2. The composition of Claim 1 wherein the catalyst is an imidazole.

3. The composition of Claim 2 wherein the imidazole is 2-phenyl imidazole.

4. The composition of Claim 1 wherein *n* and *a* have each an average value of about 5.

5. The composition of Claim 1 wherein the silazane is selected from the group consisting of (1)

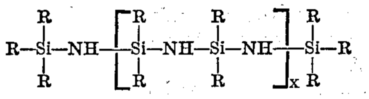

wherein the R's are the same or different hydrocarbons groups and *x* is zero or a positive integer, and (2) cyclic silazanes formed by a plurality of groups

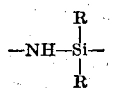

wherein the R's are the same or different hydrocarbon groups.

6. The molding composition of Claim 1 wherein the surface-treated fused silica constitutes not less than about 50% by weight of the composition and has a particle size distribution such that not less than about 70% by weight is smaller than 20 microns and not more than about 20% by weight is smaller than 5 microns.

7. The composition of Claim 6 wherein the silazane is selected from the group consisting of (1)

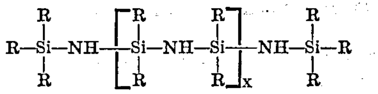

wherein the R's are the same or different hydrocarbon groups and *x* is zero or a positive integer, and (2) cyclic silazanes formed by a plurality of groups

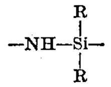

wherein the R's are the same or different hydrocarbon groups.

References Cited

UNITED STATES PATENTS

| | | | |
|---|---|---|---|
| 3,493,630 | 2/1970 | Salensky | 260—38 X |
| 3,635,743 | 1/1972 | Smith | 106—288 Q |

ALLAN LIEBERMAN, Primary Examiner

E. S. PARR, Assistant Examiner

U.S. Cl. X.R.

106—288 B; 260—38, 831